(12) United States Patent
Yu et al.

(10) Patent No.: US 12,119,226 B2
(45) Date of Patent: Oct. 15, 2024

(54) METHOD FOR MANUFACTURING MASK STRUCTURE, SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yexiao Yu, Hefei (CN); Zhongming Liu, Hefei (CN); Jia Fang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 462 days.

(21) Appl. No.: 17/451,967

(22) Filed: Oct. 22, 2021

(65) Prior Publication Data
US 2022/0310391 A1  Sep. 29, 2022

Related U.S. Application Data

(63) Continuation of application No. PCT/CN2021/107781, filed on Jul. 22, 2021.

(30) Foreign Application Priority Data

Mar. 29, 2021 (CN) .......................... 202110336089.9

(51) Int. Cl.
*H01L 21/033* (2006.01)
*H01L 21/02* (2006.01)
(Continued)

(52) U.S. Cl.
CPC .... *H01L 21/0332* (2013.01); *H01L 21/02115* (2013.01); *H01L 21/0214* (2013.01);
(Continued)

(58) Field of Classification Search
CPC .......... H01L 21/0332; H01L 21/31144; H01L 21/0337; H01L 21/02115; H01L 21/76802
See application file for complete search history.

(56) References Cited

U.S. PATENT DOCUMENTS 9,905,754 B1 * 2/2018 Yoon ...................... H10N 50/01
11,289,366 B1 * 3/2022 Chuang ............... H01L 21/0337
(Continued)

FOREIGN PATENT DOCUMENTS

CN 103779191 A 5/2014
CN 104078366 A 10/2014
(Continued)

OTHER PUBLICATIONS

International Search Report in Application No. PCT/CN2021/107781, mailed on Dec. 10, 2021.

*Primary Examiner* — Bac H Au
(74) *Attorney, Agent, or Firm* — Syncoda LLC; Feng Ma

(57) ABSTRACT

A method for manufacturing the mask structure includes: forming a first mask layer, a first buffer layer, a second mask layer, and a second buffer layer sequentially stacked from bottom to top; patterning the second buffer layer and the second mask layer, as to obtain a first pattern structure, the first pattern structure exposes a part of the first buffer layer; forming a first mask pattern on sidewalls of the first pattern structure; forming a carbon plasma layer as a protective layer on an exposed part of an upper surface of the first buffer layer; removing the first pattern structure; and removing a remaining protective layer.

8 Claims, 5 Drawing Sheets

(51) Int. Cl.
    *H01L 21/311* (2006.01)
    *H01L 21/768* (2006.01)
(52) U.S. Cl.
    CPC .. *H01L 21/02164* (2013.01); *H01L 21/31144* (2013.01); *H01L 21/76802* (2013.01); *H01L 21/76883* (2013.01)

(56) References Cited

U.S. PATENT DOCUMENTS

| | | | | |
|---|---|---|---|---|
| 2004/0161927 A1* | 8/2004 | Hu | ................... | H01L 21/76826 |
| | | | | 438/653 |
| 2004/0229470 A1* | 11/2004 | Rui | ................... | H01L 21/31138 |
| | | | | 257/E21.256 |
| 2005/0202683 A1* | 9/2005 | Wang | ................ | H01L 21/02274 |
| | | | | 438/778 |
| 2008/0057735 A1* | 3/2008 | Gil | ................... | H01L 21/32139 |
| | | | | 257/E21.259 |
| 2008/0305642 A1* | 12/2008 | Lee | .................... | H01L 21/0337 |
| | | | | 257/E21.249 |
| 2009/0061329 A1* | 3/2009 | Hirota | ................ | H01L 21/3146 |
| | | | | 430/5 |
| 2010/0285669 A1* | 11/2010 | Shima | ............... | H01L 21/32139 |
| | | | | 257/E21.218 |
| 2013/0108833 A1* | 5/2013 | Brink | ................ | H01L 21/31144 |
| | | | | 428/156 |
| 2014/0091434 A1* | 4/2014 | Hopkins | ............. | H01L 21/3088 |
| | | | | 257/618 |
| 2015/0162205 A1* | 6/2015 | Wu | ................... | H01L 21/02123 |
| | | | | 438/618 |
| 2016/0005596 A1* | 1/2016 | Behera | ............. | H01L 21/02115 |
| | | | | 438/703 |
| 2016/0365248 A1* | 12/2016 | Mebarki | ........... | H01L 21/02118 |
| 2018/0096857 A1* | 4/2018 | Zhou | ........... | H01L 21/76802 |
| 2019/0311900 A1* | 10/2019 | Pandit | ............... | H01L 21/67069 |
| 2020/0035496 A1* | 1/2020 | Kakimoto | ......... | H01L 21/67276 |
| 2020/0168468 A1* | 5/2020 | Ishii | ................. | H01J 37/32082 |
| 2021/0358764 A1* | 11/2021 | Wu | ................... | H01L 21/31111 |
| 2022/0059359 A1* | 2/2022 | Wang | ................... | C23C 16/045 |
| 2022/0246437 A1* | 8/2022 | Xia | ................... | H01L 21/76224 |

FOREIGN PATENT DOCUMENTS

| | | |
|---|---|---|
| CN | 104517813 A | 4/2015 |
| CN | 103779191 B | 8/2016 |
| CN | 106206307 A | 12/2016 |
| CN | 112017950 A | 12/2020 |
| CN | 113078105 A | 7/2021 |

* cited by examiner

METHOD FOR MANUFACTURING MASK STRUCTURE, SEMICONDUCTOR STRUCTURE AND MANUFACTURING METHOD THEREOF

CROSS-REFERENCE TO RELATED APPLICATIONS

This is a continuation of International Application No. PCT/CN2021/107781 filed on Jul. 22, 2021, which claims priority to Chinese Patent Application No. 202110336089.9 filed to the China National Intellectual Property Administration on Mar. 29, 2021 and entitled "Method for Preparation Mask Structure, Semiconductor Structure and Preparation Method thereof", the disclosure of which is hereby incorporated by reference in its entirety.

BACKGROUND

With the development of a semiconductor technology, in order to meet the requirements of a storage device for the accuracy of a photo etching technology, for a semiconductor device with a process node below 45 nm, a Self-aligned Double Patterning (SADP) technology is usually used to form a photo etching pattern.

SUMMARY

The disclosure relates to the technical field of semiconductors, and in particular to a method for manufacturing a mask structure, a semiconductor structure and a manufacturing method thereof.

According to some embodiments, a method for manufacturing a mask structure, a semiconductor structure and a manufacturing method thereof are provided.

A method for manufacturing a mask structure includes:
A first mask layer, a first buffer layer, a second mask layer and a second buffer layer which are sequentially stacked from bottom to top are formed;
The second buffer layer and the second mask layer are patterned, as to obtain a first pattern structure, the first pattern structure exposes a part of the first buffer layer;
A first mask pattern is formed on sidewalls of the first pattern structure;
A carbon plasma layer is formed as a protective layer on an exposed part of an upper surface of the first buffer layer;
The first pattern structure is removed;
A remaining protective layer is removed.

A method for manufacturing a semiconductor structure includes:
A substrate is provided;
A material layer to be etched is formed on the substrate;
A target mask pattern is manufactured on an upper surface of the material layer to be etched by the above method for manufacturing the mask structure;
The material layer to be etched is etched on the basis of the target mask pattern, as to obtain the semiconductor structure;
A semiconductor structure is obtained by any one of the above manufacturing methods for the semiconductor structure.

The above description is only an overview of technical schemes of the disclosure. In order to understand technical means of the disclosure more clearly and implement it in accordance with the content of the description, the disclosure is described in detail below with reference to preferred embodiments of the disclosure in combination with drawings.

BRIEF DESCRIPTION OF THE DRAWINGS

In order to more clearly describe technical schemes in embodiments of the disclosure or traditional technologies, drawings that need to be used in the descriptions of the embodiments or the traditional technologies are briefly introduced below. It is apparent that the drawings in the following descriptions are merely some embodiments of the disclosure, for those of ordinary skill in the art, other drawings may be obtained according to these drawings under a precondition without creative work.

DETAILED DESCRIPTION

Figure 1:
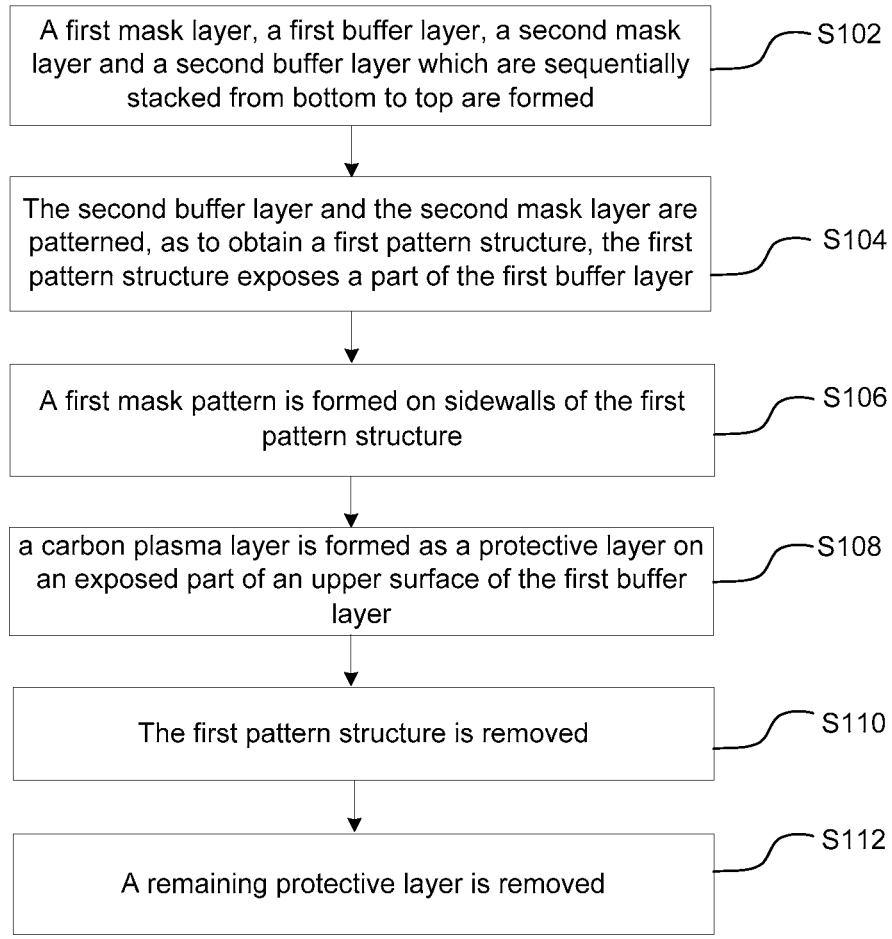
FIG. 1 is a flow schematic diagram of a method for manufacturing a mask structure in an embodiment.

To facilitate an understanding of the disclosure, the disclosure will be described below in detail with reference to the accompanying drawings. Preferred embodiments of the disclosure are given in the accompanying drawings. However, the disclosure may be embodied in many different forms and should not be limited to the embodiments set forth herein. Rather, these embodiments are provided so that the disclosure will be thorough and complete.

Unless defined otherwise, all technical and scientific terms used herein have the same meaning as commonly understood by those of ordinary skill in the art to which the disclosure belongs. The terms used herein in the specification of the disclosure are for the purpose of describing specific embodiments only and are not intended to limit the disclosure.

It is to be understood that when an element or a layer is referred to as being "on", "adjacent to", "connected to", or "coupled to", to other elements or layers, it may be directly on, adjacent to, connected to, or coupled to the other elements or layers, or an intervening element or layer may be present. Rather, when an element is referred to as being "directly on", "directly adjacent to", "directly connected to", or "directly coupled to" other elements or layers, it may be directly on, adjacent to, connected to, or coupled to the other elements or layers, or an intervening element or layer may be present. It is to be understood that although the terms first, second, third, and the like may be used to describe various elements, components, regions, layers, doping types, and/or parts, these elements, components, regions, layers, doping types, and/or parts should not be limited by these terms. These terms are only used to distinguish one element, component, region, layer, doping type, or part from another element, component, region, layer, doping type, or part. Therefore, a first element, component, region, layer, doping type, or part discussed below may be represented as a second element, component, region, layer, or part without departing from the teachings of embodiments of the disclosure. For example, the first doping type may be the second doping type, and similarly, the second doping type may be the first doping type. The first doping type and the second doping type are different doping types, for example, the first doping type may be P-type and the second doping type may be N-type, or the first doping type may be N-type and the second doping type may be P-type.

Spatial relation terms such as "under", "underneath", "lower", "below", "above", "upper", and the like, may be used herein to describe a relation between one element or feature and other elements or features as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it", the element or feature will be oriented "over" the other element or feature. Therefore, the exemplary terms "underneath" and "below" may include both upper and lower orientations. In addition, the device may also include additional orientations (for example, rotated 90 degrees or other orientations), and the spatial descriptors used herein are interpreted accordingly.

As used herein, the singular forms "a", "an", and "the/the" may include the plural forms as well, unless the context clearly indicates otherwise. It is also to be understood that when the terms "constituting" and/or "comprising" are used in the specification, the presence of a stated feature, integer, step, operation, element, and/or component may be determined, but the presence or addition of one or more other features, integers, steps, operations, elements, components, and/or groups is not precluded. Meanwhile, the term "and/or" used herein includes any and all combinations of the associated listed items.

The embodiments of the disclosure are described herein with reference to sectional views that are used as schematic diagrams of ideal embodiments (intervening structures) of the embodiments of the disclosure, so that changes in shape may be expected due to, for example, a manufacturing technique and/or a tolerance. Therefore, the embodiments of the disclosure should not be limited to special shapes of regions shown herein but include shape deviations caused by the manufacturing technique. For example, an injection region shown as a rectangle typically has a round or bending feature and/or injection concentration gradient at an edge thereof, rather than a binary change from the injection region to a non-injection region. Likewise, a burial region formed through injection may result in some injection in a region between the burial region and a surface through which the injection is performed. Therefore, the regions shown in the figures are substantially schematic, and shapes thereof neither represent actual shapes of the regions of the device nor limit the scope of the embodiments of the disclosure.

A typical process of forming a bit line pattern by the self-aligned double patterning technology can includes the following steps. In a first step, a first sacrificial film layer, a first hard mask layer, a second sacrificial film layer, a second hard mask layer and a photoresist pattern are sequentially formed on a substrate on which a pattern film layer is formed. In a second step, firstly, the first hard mask layer is used as an etching barrier layer, the photoresist pattern is transferred to the second sacrificial film layer and the second hard mask layer, as to obtain laminated second sacrificial layer and second mask layer, and then sidewalls structure covering sidewalls of the second sacrificial layer and the second mask layer is formed. In a third step, in a process of sequentially etching and removing the second mask layer of the second sacrificial layer, the first hard mask layer that is not covered by the sidewall structure or the second sacrificial layer is partially etched, so that the thickness of the first hard mask layer on the first sacrificial film layer is different. In a fourth step, sidewalls structure pattern is transferred to the first sacrificial film layer, as to obtain a first sacrificial layer pattern which is composed of the first sacrificial film layer and the same as the sidewall structure pattern, because the thickness of the first hard mask layer on the first sacrificial film layer is different, in the case of over-etching, the sidewall of the first sacrificial layer close to a position in which the thickness of the first hard mask layer is relatively low is etched inwards, and the distortion of the pattern is caused. In a fifth step, the first sacrificial layer pattern is transferred to the pattern film layer, as to obtain a twisted bit line pattern, so that a finally obtained bit line structure may have a certain degree of the distortion, thereby the performance of the storage device is affected.

Referring to FIG. 1, it is a flow schematic diagram of a method for manufacturing a mask structure in an embodiment.

In one of the embodiments, a method for manufacturing a mask structure is provided.

As shown in FIG. 1, the manufacturing method includes:

S102, a first mask layer, a first buffer layer, a second mask layer and a second buffer layer which are sequentially stacked from bottom to top are formed.

S104, the second buffer layer and the second mask layer are patterned, as to obtain a first pattern structure, the first pattern structure exposes a part of the first buffer layer.

S106, a first mask pattern is formed on sidewalls of the first pattern structure.

S108, a carbon plasma layer is formed as a protective layer on an exposed part of an upper surface of the first buffer layer.

S110, the first pattern structure is removed.

S112, a remaining protective layer is removed.

In the method for manufacturing the mask structure of the present invention, the carbon plasma layer is formed as the protective layer on the exposed upper surface of the first buffer layer, so that while the first pattern structure is removed by etching, the exposed upper surface of the first buffer layer may not be etched, the influence, caused by the uneven thickness of the first buffer layer, on the pattern morphology after the first mask pattern is transferred to the first buffer layer is avoided, so that the pattern morphology of the first mask pattern is completely transferred to the next layer.

In one of the embodiments, in S110, the first pattern structure is removed while a part of the protective layer is removed, the carbon plasma layer is formed as the protective layer on the exposed upper surface of the first buffer layer, and the first pattern structure and a part of the protective layer are removed, belong to different operations of the same process menu. Namely, in a process of removing the first pattern structure, the protective layer on the upper surface of the first buffer layer is removed without damaging the first buffer layer under the protective layer, the carbon plasma layer is formed as the protective layer, and the first pattern structure and a part of the protective layer are removed, which belong to the different operations of the same etching process menu, and it is completed on the same etching machine, such as an AMAT etching machine.

Figure 2:
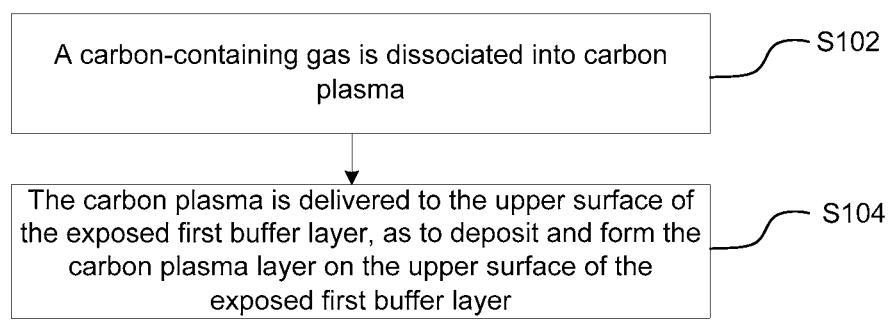
FIG. 2 is a flow schematic diagram of forming a carbon plasma layer on an exposed part of an upper surface of the first buffer layer in an embodiment.

Referring to FIG. 2, it is a flow schematic diagram of forming a carbon plasma layer on the exposed upper surface of the first buffer layer in an embodiment.

As shown in FIG. 2, in one of the embodiments, forming the carbon plasma layer on the exposed upper surface of the first buffer layer includes:

S202, a carbon-containing gas is dissociated into carbon plasma.

S204, the carbon plasma is delivered to the exposed upper surface of the first buffer layer, as to deposit and form the carbon plasma layer on the exposed upper surface of the first buffer layer.

Specifically, firstly, after the carbon-containing gas is transferred to a process chamber of a process machine, the process machine dissociates the carbon-containing gas in the process chamber into the carbon plasma, namely the carbon-containing gas is dissociated under an alternating electric field in the process chamber, and the carbon plasma is generated. Secondly, the carbon plasma is transferred to the exposed upper surface of the first buffer layer under the action of a longitudinal electric field in the process chamber, and deposited to form the carbon plasma layer, herein the thickness of the carbon plasma layer is not less than a first preset value, the first preset value refers to the thickness of the carbon plasma layer that is removed at the same time while the first pattern structure is removed. Through this arrangement, the first buffer layer under the protective layer may not be damaged while the first pattern structure is removed. For example, the thickness of the carbon plasma layer is 5 nanometers, 10 nanometers, 20 nanometers and the like.

In one of the embodiments, the carbon-containing gas includes methane, in a process of forming the carbon plasma layer on the exposed upper surface of the first buffer layer, a formation pressure is not less than 0 mtorr and not greater than 10 mtorr, a formation temperature is not less than 0° C. and not greater than 5° C., a alternating power is not less than 100 W and not greater than 500 W, the longitudinal bias power is not less than 500 W and not greater than 1000 W, and a period of time is not less than 200 seconds and not greater than 300 seconds. Namely the chamber pressure of the process chamber is a vacuum low pressure of 0 mtorr to 10 mtorr, the chamber temperature is a low temperature of 0° C. to 5° C., the alternating power corresponding to the chamber is 100 W to 500 W, the longitudinal bias power corresponding to the chamber is 500 W to 1000 W, and the process time for forming the carbon plasma layer is 200 s to 300 s.

In one of the embodiments, in the process of forming the carbon plasma layer on the exposed upper surface of the first buffer layer, a gas flow rate of the methane is not less than 100 standard milliliters per minute and not greater than 200 standard milliliters per minute.

In one of the embodiments, in the period of time, a deposition time of the carbon plasma deposition to form the carbon plasma layer is not less than 20 seconds and not greater than 80 seconds, such as 40 seconds, and 60 seconds.

In one of the embodiments, the first mask layer includes an inorganic carbon layer. The second mask layer includes a spin-coating organic carbon layer, both the first buffer layer and the second buffer layer include a silicon oxynitride layer, the first mask pattern includes a silicon oxide layer.

In one of the embodiments, S112 includes: a wet cleaning process is performed to remove the remaining protective layer.

In one of the embodiments, after S112, the method further includes:

The first buffer layer and the first mask layer are sequentially patterned on the basis of the first mask pattern, as to obtain the target mask pattern.

Figure 3:
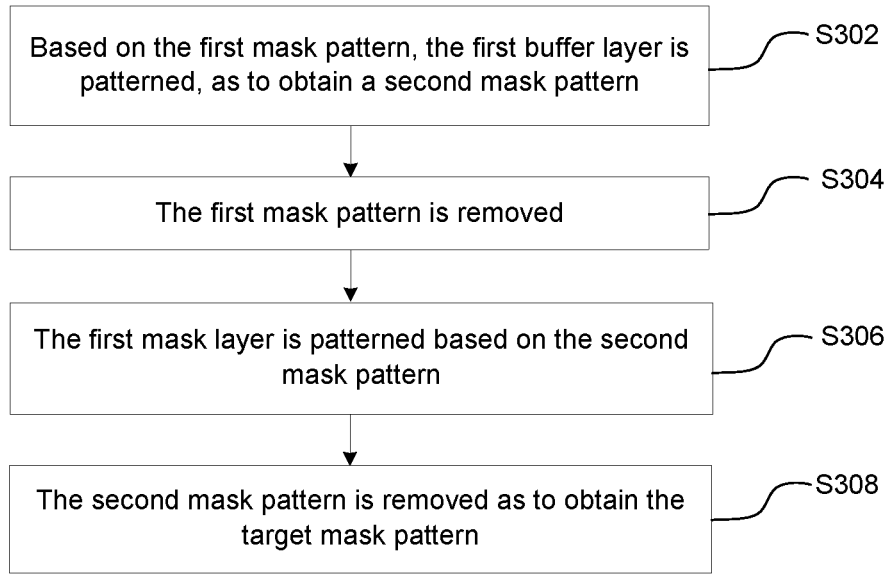
FIG. 3 is a flow schematic diagram of sequentially patterning a first buffer layer and a first mask layer based on a first mask pattern to obtain a target mask pattern in an embodiment.

Referring to FIG. 3, it is a flow schematic diagram of sequentially patterning a first buffer layer and a first mask layer based on a first mask pattern to obtain a target mask pattern in an embodiment.

As shown in FIG. 3, in one of the embodiments, sequentially patterning the first buffer layer and the first mask layer based on the first mask pattern to obtain the target mask pattern includes:

S302, based on the first mask pattern, the first buffer layer is patterned, as to obtain a second mask pattern.

Specifically, the first mask pattern is used as a mask, the first buffer layer that is not covered by the first mask pattern is removed by a wet etching process and/or a dry etching process, as to obtain the second mask pattern formed by a remaining first buffer layer, because the first buffer layer is not damaged while the first pattern structure is removed, at this time, the second mask pattern is the same as a pattern of the first mask pattern, namely the shape of the first mask pattern is correctly transferred to the second mask pattern.

S304, the first mask pattern is removed.

Specifically, the first mask pattern on the second mask pattern is removed by etching, and an etching process well-known to those skilled in the art may be selected to remove the first mask pattern.

S306, the first mask layer is patterned on the basis of the second mask pattern.

Specifically, the second mask pattern is used as a mask, and the first mask layer that is not covered by the second mask pattern is removed by the wet etching process and/or the dry etching process, as to obtain a third mask pattern formed by a remaining first mask layer, at this time, the third mask pattern is the same as the pattern of the first mask pattern.

S308, the second mask pattern is removed, as to obtain the target mask pattern.

Specifically, the second mask pattern on the third mask pattern is removed by etching, and an etching process well-known to those skilled in the art may be selected to remove the second mask pattern, as to obtain the target mask pattern formed by the third mask pattern.

Figure 4:
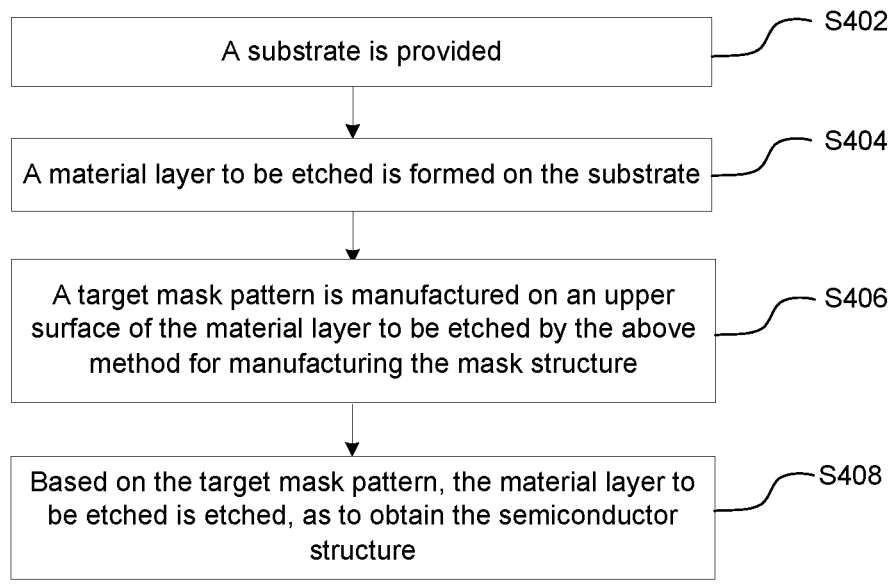
FIG. 4 is a flow schematic diagram of a method for manufacturing a semiconductor structure in an embodiment.
Figure 5:
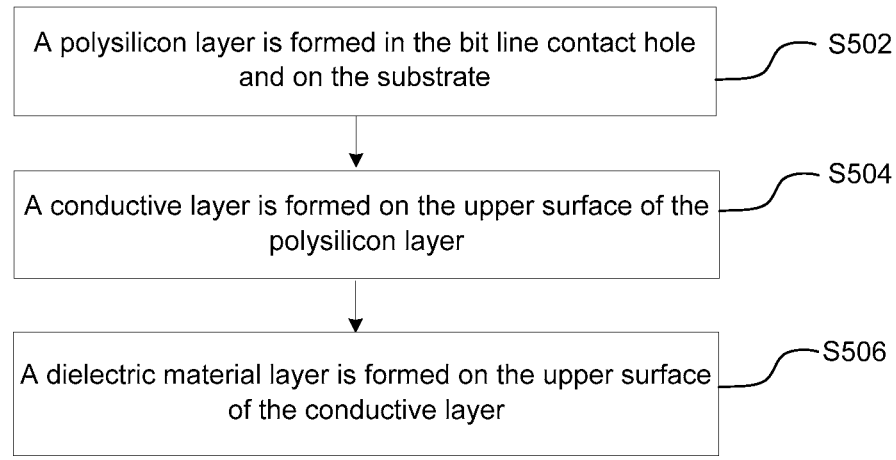
FIG. 5 is a flow schematic diagram of forming a material layer to be etched on a substrate in an embodiment.
Figure 6:
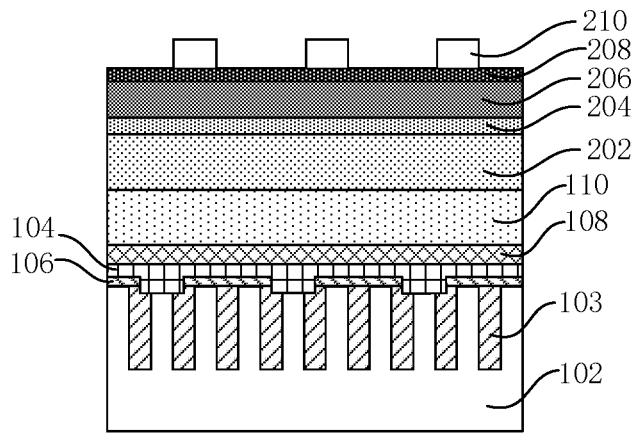
FIG. 6 is a cross-sectional schematic diagram of the semiconductor structure before forming the first pattern structure in an embodiment.

Referring to FIG. 4, it is a flow schematic diagram of a method for manufacturing a semiconductor structure in an embodiment. Referring to FIG. 5, it is a flow schematic diagram of forming a material layer to be etched on a substrate in an embodiment. Referring to FIG. 6, it is a cross-sectional schematic diagram of the semiconductor structure before forming the first pattern structure in an embodiment.

In one of the embodiments, a method for manufacturing a semiconductor structure is further provided. As shown in FIG. 4, the manufacturing method includes:

S402, a substrate is provided.

Specifically, the substrate is provided, an active area and an isolation structure are formed on the substrate, and the substrate may be made of undoped single crystal silicon, single crystal silicon doped with impurities, silicon-on-insulator (SOI), strained silicon on insulator (SSOI), stacked silicon germanium on insulator (S—SiGeOI), silicon germanium on insulator (SiGeOI), and germanium on insulator (GeOI) and the like. As an example, in this embodiment, the constituent material of the substrate is single crystal silicon.

S404, a material layer to be etched is formed on the substrate.

As shown in FIG. 5 and FIG. 6, in one of the embodiments, a bit line contact hole is formed on the substrate. S404 includes:

S502, a polysilicon layer is formed in the bit line contact hole and on the substrate.

Specifically, as shown in FIG. 6, the active area, the isolation structure 103 for isolating adjacent active areas, and the bit line contact hole are formed in the substrate 102, herein the bit line contact hole exposes the active area in the substrate 102. Firstly, the polysilicon layer 104 is formed on the substrate 102, the polysilicon layer 104 fills the bit line contact hole, and extends along sidewalls of the bit line contact hole to cover the substrate 102. Herein, the polysilicon layer 104 in the bit line contact hole is in electrical contact with the active area at the bottom of the bit line contact hole, and the polysilicon layer 104 on the substrate 102 is insulated from the underlying substrate 102.

In one of the embodiments, S502 includes:

Firstly, an intrinsic polysilicon layer is formed in the bit line contact hole and on an upper surface of the substrate 102, namely the intrinsic polysilicon layer is formed on the upper surface of the substrate 102, the intrinsic polysilicon layer fills the bit line contact hole, and extends along the sidewall of the bit line contact hole to cover the upper surface of the substrate 102. Secondly, the intrinsic polysilicon layer located in the bit line contact hole is doped, so that the intrinsic polysilicon layer in the bit line contact hole is transformed into a doped polysilicon layer, and is in electrical contact with the active area at the bottom of the substrate 102, and a part of the intrinsic polysilicon layer on the upper surface of the substrate 102 is transformed into a doped polysilicon layer, and is insulated from the underlying substrate 102.

In one of the embodiments, before S502, the method further includes: an insulating dielectric layer 106 is formed on the substrate 102, herein the bit line contact hole passes through the insulating dielectric layer 106.

In one of the embodiments, S502 includes:

Firstly, an intrinsic polysilicon layer is formed in the bit line contact hole and on an upper surface of the insulating dielectric layer 106, namely the insulating dielectric layer 106 is located between the substrate 102 and the intrinsic polysilicon layer, the intrinsic polysilicon layer fills the bit line contact hole, and extends along the sidewall of the bit line contact hole to cover the upper surface of the insulating dielectric layer 106. Secondly, the intrinsic polysilicon layer is doped, so that the intrinsic polysilicon layer is transformed into a doped polysilicon layer. Through forming the doped polysilicon layer, the electrical contact between the polysilicon layer 104 and the active area in the substrate is achieved.

In one of the embodiments, the insulating dielectric layer 106 at least includes one of a silicon oxide layer and a silicon nitride layer. For example, the insulating dielectric layer 106 includes a silicon oxide layer and a silicon nitride layer sequentially stacked from the substrate.

S504, a conductive layer is formed on an upper surface of the polysilicon layer.

Specifically, through a film forming process well-known to those skilled in the art, such as chemical vapor deposition (CVD), physical vapor deposition (PVD), and atomic layer deposition (ALD), the conductive layer 108 is formed on the upper surface of the polysilicon layer 104.

In one of the embodiments, the conductive layer 108 includes a secondary conductive layer and a primary conductive layer that are sequentially stacked from the upper surface of the polysilicon layer 104, such as a titanium nitride layer and a tungsten metal layer stacked sequentially.

S506, a dielectric material layer is formed on an upper surface of the conductive layer.

Specifically, through a film forming process well-known to those skilled in the art, such as chemical vapor deposition (CVD), physical vapor deposition (PVD), and atomic layer deposition (ALD), the dielectric material layer 110 is formed on the upper surface of the conductive layer 108, herein the target mask pattern is formed on an upper surface of the dielectric material layer 110.

In one of the embodiments, the conductive layer 108 includes a secondary conductive layer and a primary conductive layer that are sequentially stacked from the upper surface of the polysilicon layer 104, such as a titanium nitride layer and a tungsten metal layer stacked sequentially, and the dielectric material layer 110 includes a silicon nitride layer.

S406, A target mask pattern is manufactured on an upper surface of the material layer to be etched by the above method for manufacturing the mask structure.

Figure 7:
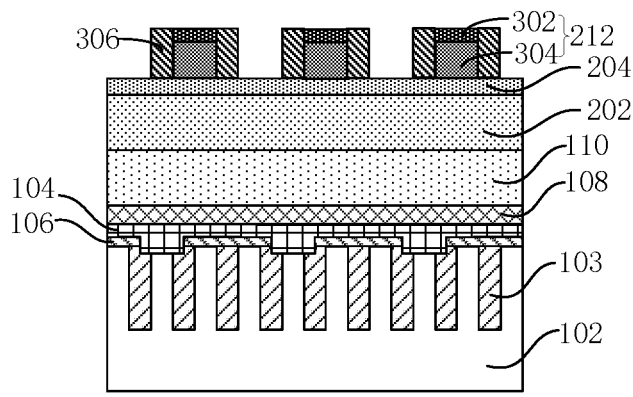
FIG. 7 is a cross-sectional schematic diagram of the semiconductor structure after forming the first mask pattern in an embodiment.
Figure 8:
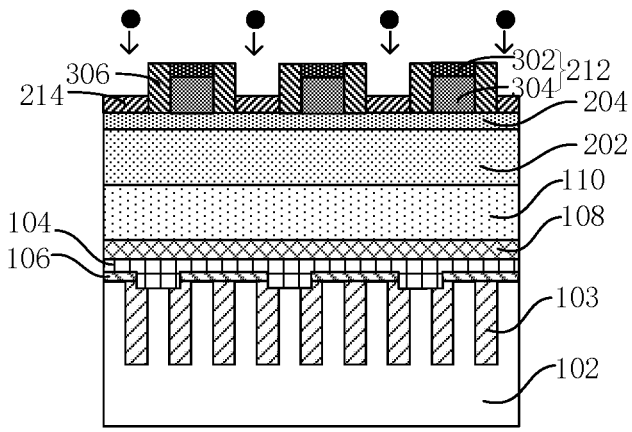
FIG. 8 is a cross-sectional schematic diagram of the semiconductor structure after forming a protective layer in an embodiment.
Figure 9:
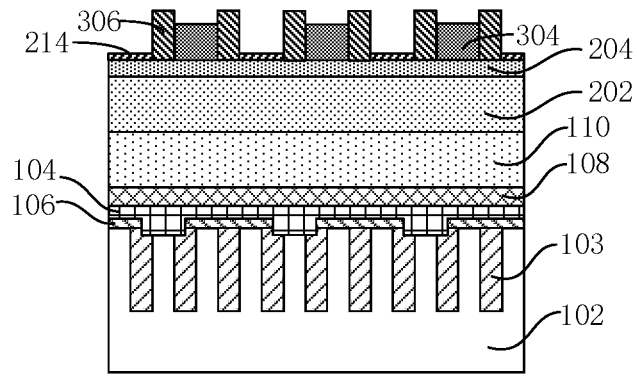
FIG. 9 is a cross-sectional schematic diagram of the semiconductor structure after removing a second buffer layer pattern in an embodiment.
Figure 10:
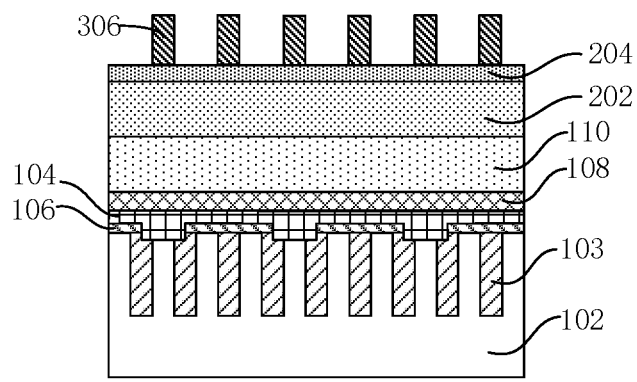
FIG. 10 is a cross-sectional schematic diagram of the semiconductor structure after removing a second mask layer pattern in an embodiment.
Figure 11:
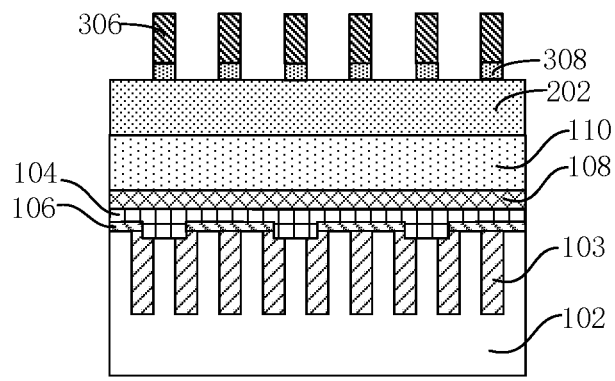
FIG. 11 is a cross-sectional schematic diagram of the semiconductor structure after forming a second mask pattern in an embodiment.
Figure 12:
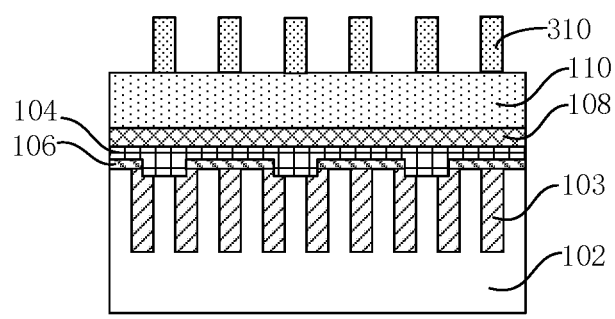
FIG. 12 is a cross-sectional schematic diagram of the semiconductor structure after forming a target mask pattern in an embodiment.

Referring to FIG. 7, it is a cross-sectional schematic diagram of the semiconductor structure after forming the first mask pattern in an embodiment. Referring to FIG. 8, it is a cross-sectional schematic diagram of the semiconductor structure after forming a protective layer in an embodiment. Referring to FIG. 9, it is a cross-sectional schematic diagram of the semiconductor structure after removing a second buffer layer pattern in an embodiment. Referring to FIG. 10, it is a cross-sectional schematic diagram of the semiconductor structure after removing a second mask layer pattern in an embodiment. Referring to FIG. 11, it is a cross-sectional schematic diagram of the semiconductor structure after forming a second mask pattern in an embodiment. Referring to FIG. 12, it is a cross-sectional schematic diagram of the semiconductor structure after forming a target mask pattern in an embodiment.

Specifically, as shown in FIGS. 6-12, forming the target mask pattern on the upper surface of the dielectric material layer 110 is as follows. In a first step, the first mask layer 202, the first buffer layer 204, the second mask layer 206 and the second buffer layer 208 are sequentially formed on the upper surface of the dielectric material layer 110. In a second step, a photoresist pattern 210 is formed on the second buffer layer 208, and the photoresist pattern 210 covers the second buffer layer 208 that needs to form a first pattern structure. In a third step, the photoresist pattern 210 is used as a mask to pattern the second buffer layer 208 and the second mask layer 206, the second buffer layer 208 and the second mask layer 206 that are not covered by the photoresist pattern 210 are removed by etching, and a part of the first buffer layer 204 is exposed to obtain the first pattern structure 212 formed the remaining second buffer layer 208 and the remaining second mask layer 206, then, the photoresist pattern 210 on the first pattern structure 212 is removed, herein the first pattern structure 212 is the same as a pattern of the photoresist pattern 210, namely the pattern of the photoresist pattern 210 is transferred to the first pattern structure 212, and the first pattern structure 212 includes a second buffer layer pattern 302 formed by a remaining second buffer layer 208 and a second mask layer pattern 304 formed by a remaining second mask layer 206. In a fourth step, a first mask pattern 306, such as a silicon oxide mask pattern, is formed on sidewalls of the first pattern structure 212. In a fifth step, the dry etching process is performed. Firstly, the carbon-containing gas such as the methane gas is transferred into the process chamber of the etching machine, and then dissociated to obtain the carbon plasma, under the action of the longitudinal electric field in the process chamber, the carbon plasma is transferred to the exposed upper surface of the first buffer layer 204, and deposited to form the carbon plasma layer 214, at this time, the cross-sectional schematic diagram of the semiconductor structure is shown in FIG. 8. Secondly, the first etching gas is transferred into the process chamber of the etching machine, and the second buffer layer pattern 302 is removed by dry etching, at this time, a part of the carbon plasma layer 214 on the upper surface of the first buffer layer 204 may be removed by etching, and at this time, the cross-sectional schematic diagram of the semiconductor structure is shown in FIG. 9. Once again, the second etching gas is transferred into the process chamber of the etching machine, and the second mask layer pattern 304 is removed by dry etching, at this time, a remaining carbon plasma layer 214 on the upper surface of the first buffer layer 204 is completely etched, in an ideal state, the remaining carbon plasma layer 214 on the upper surface of the first buffer layer 204 and the second mask layer pattern 304 are simultaneously etched away. So far, the operation of the dry etching process menu in the same process chamber of the same etching machine is completed. In a sixth step, a residual carbon plasma layer 214 is removed, for example, a residual carbon on the upper surface of the first buffer layer 204 is removed by the wet etching process, at this time, the film thickness of the first buffer layer 204 on the substrate 102 remains unchanged, and the cross-sectional schematic diagram of the semiconductor structure is shown in FIG. 10. In a seventh step, the first mask pattern 306 is used as a mask to sequentially pattern the first buffer layer 204 and the first mask layer 202, as to obtain the second mask pattern 308 formed by the remaining first buffer layer 204 and the third mask pattern 310 (namely the target mask pattern 310) formed by the remaining first mask layer 202, herein the first mask pattern 306 is used as a mask to etch and remove the excess first buffer layer 204 to obtain the second mask pattern 308, at this time, the cross-sectional schematic diagram of the semiconductor structure is shown in FIG. 11. Then the first mask pattern 306 is removed. After that, the second mask pattern 308 is used as a mask to etch and remove the excess first mask layer 202 to obtain the third mask pattern 310, and then the second mask pattern 308 is removed, at this time, the cross-sectional schematic diagram of the semiconductor structure is shown in FIG. 12. So far, the manufacture of the target mask pattern 310 is completed, because the film thickness of the first buffer layer 204 on the substrate 102 remains unchanged, in the process of forming the target mask pattern 310, the pattern shape of the first mask pattern 306 is completely transferred to the next layer, and the target mask pattern 310 that is the same as the pattern of the first mask pattern 306 is obtained.

S408, based on the target mask pattern, the material layer to be etched is etched, as to obtain the semiconductor structure.

Figure 13:
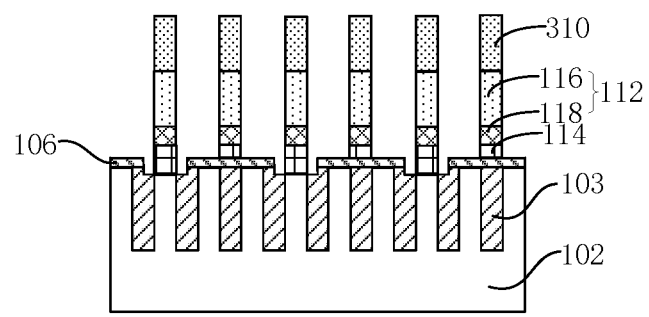
FIG. 13 is a cross-sectional schematic diagram of the semiconductor structure after a bit line structure and a bit line contact structure are obtained in an embodiment.

Referring to FIG. 13, it is a cross-sectional schematic diagram of the semiconductor structure after a bit line structure and a bit line contact structure are obtained in an embodiment.

As shown in FIG. 12 and FIG. 13, in one of the embodiments, S408 includes:

The dielectric material layer 110, the conductive layer 108, and the polysilicon layer 104 are sequentially etched on the basis of the target mask pattern 310, as to obtain the bit line structure 112 and the bit line contact structure 114, and the semiconductor structure is formed by the bit line structure 112 and the bit line contact structure 114 together. Herein the bit line structure 112 includes a top dielectric layer 116 formed a remaining dielectric material layer 110 and a conductive structure 118 formed a remaining conductive layer 108.

In one of the embodiments, after the semiconductor structure is formed, an operation of removing the target mask pattern 310 is further included.

A semiconductor structure is further provided, the semiconductor structure is manufactured by any one of the above manufacturing methods for the semiconductor structure.

In the semiconductor structure and the manufacturing method thereof of the present invention, the carbon plasma layer is formed as the protective layer on the exposed upper surface of the first buffer layer, so that while the first pattern structure is removed by etching, the exposed part of an upper surface of the first buffer layer is not etched, the influence, caused by the uneven thickness of the first buffer layer, on the pattern morphology after the first mask pattern is transferred to the first buffer layer is avoided, so that the pattern morphology of the first mask pattern is completely transferred to the next layer, thereby the semiconductor structure formed by the bit line structure and the bit line contact structure with the same pattern morphology as the first mask pattern is obtained.

It should be understood that although the various operations in the flow diagram of FIG. 1 are sequentially displayed as indicated by arrows, these operations are not necessarily performed sequentially in an order indicated by the arrows. Unless there is a clear description in this article, there is no strict order for the execution of these operations, and these operations may be executed in other orders. Moreover, at least part of the operations in FIG. 1 may include a plurality of operations or a plurality of stages. These operations or stages are not necessarily executed at the same time, but may be executed at different times, and the order of execution of these operations or stages is also not necessarily performed sequentially, but may be performed in turn or alternately with other operations or at least a part of the operations or stages in other operations.

Technical features of the above embodiments may be combined arbitrarily. In order to make the description concise, all possible combinations of the various technical features of the above embodiments are not described. However, as long as there is no contradiction in the combinations of these technical features, they all should be considered as a scope described in the present invention.

The above embodiments only express several implementation modes of the disclosure, and the descriptions thereof are relatively specific and detailed, but they should not be understood as limiting a scope of the patent application. It should be pointed out that a plurality of modifications and improvements may be made by those of ordinary skill in the art without departing from the concept of the disclosure, and these all fall within a scope of protection of the disclosure. Therefore, the scope of protection of the patent in the disclosure shall be subject to the appended claims.

What claimed is:

1. A method for manufacturing a semiconductor structure, comprising:
providing a substrate;
forming a material layer to be etched on the substrate;
forming a first mask layer, a first buffer layer, a second mask layer, and a second buffer layer sequentially stacked from bottom to top;
patterning the second buffer layer and the second mask layer, as to obtain a first pattern structure, the first pattern structure exposes a part of the first buffer layer;
forming a first mask pattern on sidewalls of the first pattern structure;
forming a carbon plasma layer as a protective layer on an exposed part of an upper surface of first buffer layer on an exposed upper surface of the first buffer layer;
removing the first pattern structure; and
removing a remaining protective layer;
based on the first mask pattern, patterning the first buffer layer and the first mask layer sequentially, as to obtain a target mask pattern; and
based on the target mask pattern, etching the material layer to be etched, as to obtain the semiconductor structure;
wherein a bit line contact hole is formed on the substrate; and forming the material layer to be etched on the substrate comprises:
forming a polysilicon layer in the bit line contact hole and on the substrate;
forming a conductive layer on an upper surface of the polysilicon layer;
forming a dielectric material layer on an upper surface of the conductive layer; and
wherein the target mask pattern is formed on an upper surface of the dielectric material layer.

2. The method for manufacturing the semiconductor structure according to claim 1, wherein after forming the semiconductor structure, the method further comprises: removing the target mask pattern.

3. The method for manufacturing the semiconductor structure according to claim 1, wherein based on the target mask pattern, etching the material layer to be etched, as to obtain the semiconductor structure comprises:
based on the target mask pattern, etching the dielectric material layer, the conductive layer, and the polysilicon layer sequentially, as to obtain a bit line structure and a bit line contact structure, and the semiconductor structure is formed by the bit line structure and the bit line contact structure together.

4. The method for manufacturing the semiconductor structure according to claim 1, wherein forming the polysilicon layer in the bit line contact hole and on the substrate comprises:
forming an intrinsic polysilicon layer in the bit line contact hole and on an upper surface of the substrate; and
doping the intrinsic polysilicon layer in the bit line contact hole, so that the intrinsic polysilicon layer in the bit line contact hole is transformed into a doped polysilicon layer.

5. The method for manufacturing the semiconductor structure according to claim 1, wherein based on the first mask pattern, patterning the first buffer layer and the first mask layer sequentially, as to obtain the target mask pattern, comprises:
based on the first mask pattern, patterning the first buffer layer, as to obtain a second mask pattern;
removing the first mask pattern;
based on the second mask pattern, patterning the first mask layer; and
removing the second mask pattern, as to obtain the target mask pattern.

6. A semiconductor structure, wherein the semiconductor structure is manufactured with a method comprising:
providing a substrate;
forming a material layer to be etched on the substrate;
forming a first mask layer, a first buffer layer, a second mask layer, and a second buffer layer sequentially stacked from bottom to top;
patterning the second buffer layer and the second mask layer, as to obtain a first pattern structure, the first pattern structure exposes a part of the first buffer layer;
forming a first mask pattern on sidewalls of the first pattern structure;
forming a carbon plasma layer as a protective layer on an exposed part of an upper surface of first buffer layer on an exposed upper surface of the first buffer layer;
removing the first pattern structure;
removing a remaining protective layer;
based on the first mask pattern, patterning the first buffer layer and the first mask layer sequentially, as to obtain a target mask pattern; and
based on the target mask pattern, etching the material layer to be etched, as to obtain the semiconductor structure;
wherein a bit line contact hole is formed on the substrate; and forming the material layer to be etched on the substrate comprises:
forming a polysilicon layer in the bit line contact hole and on the substrate;
forming a conductive layer on an upper surface of the polysilicon layer; and
forming a dielectric material layer on an upper surface of the conductive layer;
wherein the target mask pattern is formed on an upper surface of the dielectric material layer.

7. The semiconductor structure according to claim 6, wherein after forming the semiconductor structure, the method further comprises: removing the target mask pattern.

8. The semiconductor structure according to claim 6, wherein based on the target mask pattern, etching the material layer to be etched, as to obtain the semiconductor structure comprises:
based on the target mask pattern, etching the dielectric material layer, the conductive layer, and the polysilicon layer sequentially, as to obtain a bit line structure and a bit line contact structure, and the semiconductor structure is formed by the bit line structure and the bit line contact structure together.

* * * * *